Feb. 4, 1964 A. GINGRANDE ETAL 3,120,573

METHOD OF CASTING ELECTRICAL COMPONENT MOUNTING PANELS

Filed March 15, 1961 2 Sheets-Sheet 1

INVENTORS
A. GINGRANDE
G. J. MAROTTA
By W. C. Parnell
ATTORNEY

METHOD OF CASTING ELECTRICAL COMPONENT MOUNTING PANELS

Filed March 15, 1961

2 Sheets-Sheet 2

INVENTORS
A. GINGRANDE
G. J. MAROTTA
By W. C. Parnell
ATTORNEY

United States Patent Office 3,120,573

Patented Feb. 4, 1964

3,120,573
METHOD OF CASTING ELECTRICAL COMPONENT MOUNTING PANELS

Arthur Gingrande, Boxford, and George J. Marotta, Andover, Mass., assignors to Western Electric Company, Incorporated, New York, N.Y., a corporation of New York Filed Mar. 15, 1961, Ser. No. 95,990
3 Claims. (Cl. 264—277)

This invention relates to the method of mounting articles so as to be partially embedded in the mounting material and in particular to the method of mounting electrical components on an insulating panel.

In the electronics field, it has been found desirable to mount electrical components on insulating strip panels in such manner that the components are disposed on one side of the panel, accessible for repair or replacement, and the conductive leads protrude from the opposite side of the panel and are thus easily accessible for wiring operations.

The usual method for mounting the components includes punching or drilling holes in an insulating panel, the holes being of such diameter that the conductive leads of the components are held when inserted into the holes. The necessary wiring operations are then performed on the protruding ends of the leads thus providing additional support for the components.

Certain difficulties are encountered in fabricating mounting panels in this manner: it is a tedious job to properly insert the component leads into the proper apertures; the component must be supported firmly during the wiring and soldering operations on the protruding lead ends; when completed, the soldered connections to the lead ends constitute a major support for the component, this tends to weaken the electrical connection and increases the possibility of electrical failure.

The object of this invention is a new and improved method of mounting electrical components on an insulating panel which overcomes these objections.

Generally, a method according to the invention includes casting a mold such as that disclosed in our copending application, Serial No. 95,104, filed March 13, 1961 and assigned to the same assignee as the present invention from a flexible plastic material pierceable by the conductive leads of the electrical components. The component leads are pierced into the mold material which supports the components in predetermined, fixed relationship in the mold cavity. Plastic insulating material, nonadherent to the mold material, is poured into the mold cavity about the component leads and allowed to harden. The flexible mold is easily stripped from the hardened panel, which firmly supports the components by the embedded portion of their leads in such manner that the components are disposed on one side of the panel and the lead ends protrude from the opposite side.

In a preferred method according to the invention, the mold is of a transparent, thin plastic material, modified cellulose acetate butyrate; the component leads are inserted into the mold material in register with a pictorial representation of the proper positions of the components, viewed through the mold material; and, the insulating plastic panel material is cold casting epoxy resin.

A complete understanding of the invention may be obtained from the following detailed description, when read in conjunction with the accompanying drawing in which.

Figure 1:
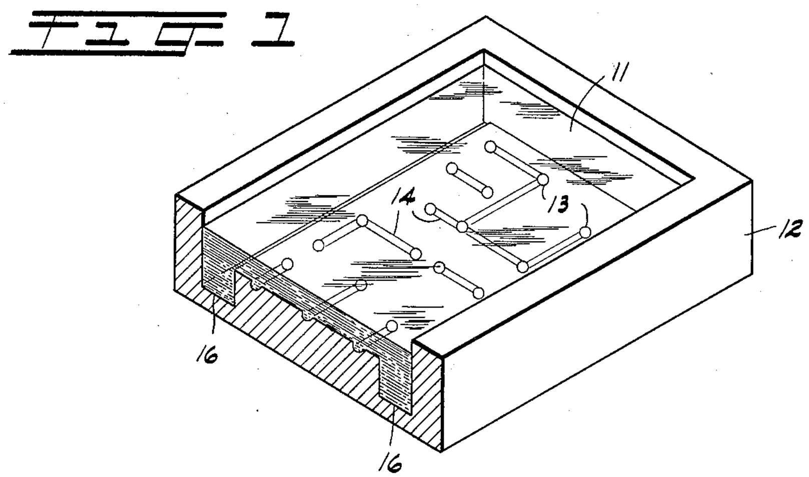
FIG. 1 is an isometric view, partly in section, of the plastic mold material being cast in a master mold.
Figure 2:
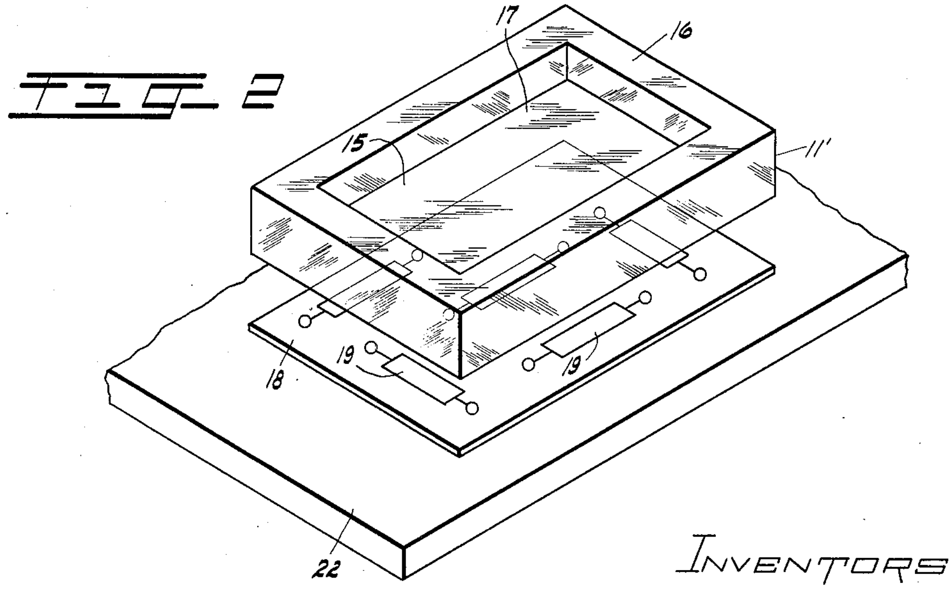
FIG. 2 is an isometric view of the plastic mold being positioned over a pictorial representation which is visible through the mold.
Figures 3, 5:
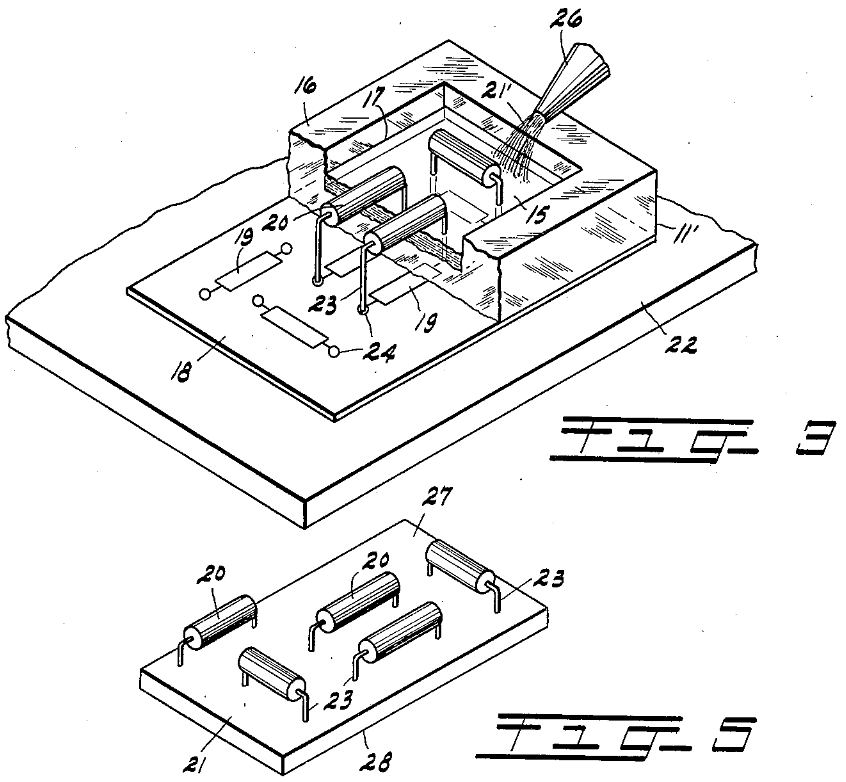
FIG. 3 is an isometric view, partly in section, showing insulating plastic panel material being poured into the mold cavity around component leads inserted into the mold in register with the pictorial representation.
Figure 4:
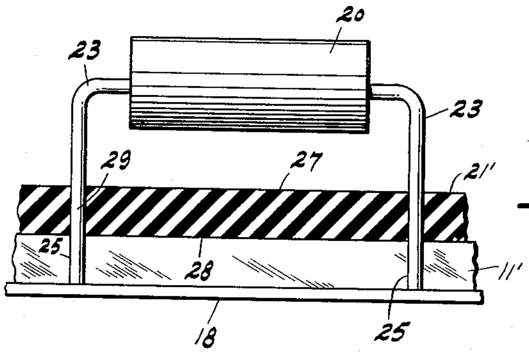
FIG. 4 is a cross-section view, showing an electrical component and a portion of the mounting panel prior to stripping the mold from the hardened panel; and, FIG. 5 is an isometric view of a hardened mounting panel from which the mold has been stripped.

Referring now to the drawings, mold material 11, a transparent thermoplastic material, is cast in a master mold 12 of desired configuration and conveniently made of metal, such as aluminum. If desired, marks 13 indicating points of insertion of component leads, and wiring paths 14 and other information or data may be embossed or engraved in the master mold 12.

When the mold material 11 has set, the mold 11′, a one-piece, transparent, cast mold having a recessed face portion 15 and elevated wall portions 16 forming a molding cavity 17, is removed from the master mold 12.

A pictorial representation 18 of the proper positions 19 of the electrical components 20, such as resistors, capacitors, etc., to be mounted on a finished mounting panel 21, is placed on a table 22 or other convenient support. The mold 11′ is placed in proper position over the pictorial representation 18 so as to be visible through the recessed face portion 15 of mold 11′ and serves as a guide for the direct insertion of the component conductive leads 23 into the recessed face portion 15 of mold 11′ in register with the insertion points 24 of pictorial representation 18. Thus there are no preformed holes in the flexible mold 11′ and the leads therefore, pierce closed surface regions in the bottom of the mold.

Insulating plastic panel material 21′ is poured from container 26 into the mold cavity 17 in direct contact with its bottom surface and about the component leads 23, the depth of the poured material 21′ representing the thickness of the hardened panel 21. The material of mold 11′ firmly supports the components 20 by the inserted portions 25 of the conductive leads 23 in predetermined fixed relation during the casting of plastic panel material 21′ in such manner that none of the plastic panel material 21′ will seep onto the inserted portions 25 of leads 23.

The plastic panel material 21′ is allowed to harden to desired consistency, either at room temperature or if the process is to be hastened, by application of heat where the temperature is not to exceed the melting temperature of the material of mold 11′. Since plastic panel material 21′ is nonadherent to mold material 11, the flexible mold 11′ is easily stripped from hardened panel 21 on which components 20 are supported by the embedded portion 29 of leads 23 so that the components 20 are disposed on one side 27 of the mounting panel 21 and the ends 25 of the leads 23 protrude from the opposite side 28 of the panel 21.

It will be noted that electrical components mounted on an insulating plastic panel in accordance with the method of this invention are firmly supported on the panel by the embedded portion of their conductive leads. The ends of the leads are free and clean of any insulating plastic material and protrude from the panel so as to be easily accessible for wiring operations. Since electrical connections to the ends of the leads will provide none of the support for the component on the panel, electrical failures at the connection points will be minimized.

It is to be understood that the above described arrangements are simply illustrative of the application of the principles of the invention. Numerous other arrangements may be readily devised by those skilled in the art which will embody the principles of the invention and fall within the spirit and scope thereof.

What is claimed is:

1. The method of casting electrical component mounting panels which comprises placing a non-porous, one-piece, flexible mold of translucent plastic material impermeable to the panel casting material and pierceable by the component leads over a pictorial representation of the proper position of the components so the representation is visible through the cavity, said mold having a cavity to contain the casting material, piercing the leads directly into the closed bottom surface of the mold cavity in register with the points of insertion depicted on the pictorial representation to vertically support the component leads in proper relation during the casting operation, pouring an insulating plastic casting material into the cavity in direct contact with the bottom surface of the cavity and to a desired depth about the exposed component leads, solidifying and hardening the plastic casting material, and stripping the mold from the hardened panel which supports the components in fixed relation by the embedded portion of the leads with the components disposed on one side of the panel and the leads protruding from the opposite side.

2. The method of casting electrical component mounting panels from epoxy which comprises placing a non-porous, one-piece, flexible mold of modified cellulose acetate butyrate over a pictorial representation of the proper position of the components so it is visible through the mold, piercing the component leads directly into the closed bottom surface of the mold cavity in register with the representation to support the components in proper position during the casting operation, pouring epoxy into the cavity in direct contact with the bottom surface of the cavity and about the exposed component leads, curing the epoxy and stripping the mold from the cured panel which supports the components in fixed relation by the embedded portion of the leads, the components disposed on one side of the panel and the leads protruding from the opposite side.

3. The method of casting electrical component mounting panels comprising piercing the leads of components directly into the closed bottom surface of a cavity defined by a non-porous, flexible, one-piece mold which is impervious to the casting material, the closed bottom surface being only thick enough to adequately support the components initially in fixed relationship prior to and during casting, and to provide the desired length of exposed leads protruding outwardly from the underside of the panel after it is cast so as to facilitate electrical connections being made thereto, pouring an insulating plastic material into and in direct contact with the bottom surface of the cavity and to a desired depth about the component leads, solidifying and hardening the plastic casting material into a rigid panel, and stripping the flexible mold from the hardened panel which supports the components in fixed relation by the embedded portions of the leads.

References Cited in the file of this patent

UNITED STATES PATENTS

| | | |
|---|---|---|
| 957,188 | Chappell | May 10, 1910 |
| 2,391,432 | Marschner et al. | Dec. 25, 1945 |
| 2,837,855 | Hoke | June 10, 1958 |
| 2,850,826 | Testa | Sept. 9, 1958 |
| 3,019,489 | Burg | Feb. 6, 1962 |
| 3,076,230 | Parker et al. | Feb. 5, 1963 |

OTHER REFERENCES

George Quayle et al.: Electronic Design, January 1955, pages 46 and 47.